United States Patent
Tang et al.

(10) Patent No.: US 12,094,936 B2
(45) Date of Patent: Sep. 17, 2024

(54) METHODS FOR FORMING A METAL SILICATE FILM ON A SUBSTRATE IN A REACTION CHAMBER AND RELATED SEMICONDUCTOR DEVICE STRUCTURES

(71) Applicant: ASM IP Holding B.V., Almere (NL)

(72) Inventors: Fu Tang, Gilbert, AZ (US); Peng-Fu Hsu, Scottsdale, AZ (US); Michael Eugene Givens, Phoenix, AZ (US); Qi Xie, Wilsele (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/376,014

(22) Filed: Oct. 3, 2023

(65) Prior Publication Data
US 2024/0030296 A1 Jan. 25, 2024

Related U.S. Application Data

(60) Continuation of application No. 17/873,885, filed on Jul. 26, 2022, now Pat. No. 11,798,999, which is a
(Continued)

(51) Int. Cl.
| | |
|---|---|
| *H01L 29/40* | (2006.01) |
| *C23C 16/40* | (2006.01) |
| *H01L 21/02* | (2006.01) |
| *H01L 21/28* | (2006.01) |
| *H01L 29/161* | (2006.01) |
| *H01L 29/51* | (2006.01) |

(Continued)

(52) U.S. Cl.
CPC .......... *H01L 29/408* (2013.01); *C23C 16/401* (2013.01); *C23C 16/403* (2013.01); *H01L 21/02145* (2013.01); *H01L 21/022* (2013.01); *H01L 21/02205* (2013.01); *H01L 21/0228* (2013.01); *H01L 21/28158* (2013.01); *H01L 29/161* (2013.01); *H01L 29/513* (2013.01); *H01L 29/517* (2013.01); *H01L 29/66477* (2013.01); *H01L 29/78* (2013.01)

(58) Field of Classification Search
CPC ................ C23C 16/401; C23C 16/403; H01L 21/02145; H01L 21/022; H01L 21/02205; H01L 21/0228; H01L 21/2807; H01L 21/28158; H01L 29/161; H01L 29/408; H01L 29/513; H01L 29/517; H01L 29/66477; H01L 29/78
See application file for complete search history.

(56) References Cited

U.S. PATENT DOCUMENTS

| | | | |
|---|---|---|---|
| 6,900,144 B2 | 5/2005 | Maeda et al. | |
| 6,939,579 B2 | 9/2005 | Bondestam et al. | |

(Continued)

FOREIGN PATENT DOCUMENTS

| | | |
|---|---|---|
| KR | 20050081022 A | 8/2005 |
| TW | 201725278 A | 4/2017 |

*Primary Examiner* — Robert G Bachner
(74) *Attorney, Agent, or Firm* — Snell & Wilmer L.L.P.

(57) ABSTRACT

Methods for forming a metal silicate film on a substrate in a reaction chamber by a cyclical deposition process are provided. The methods may include: regulating the temperature of a hydrogen peroxide precursor below a temperature of 70° C. prior to introduction into the reaction chamber, and depositing the metal silicate film on the substrate by performing at least one unit deposition cycle of a cyclical deposition process. Semiconductor device structures including a metal silicate film formed by the methods of the disclosure are also provided.

20 Claims, 3 Drawing Sheets

Related U.S. Application Data continuation of application No. 17/026,510, filed on Sep. 21, 2020, now Pat. No. 11,411,088, which is a division of application No. 16/194,041, filed on Nov. 16, 2018, now Pat. No. 10,818,758.

(51) Int. Cl.
*H01L 29/66* (2006.01)
*H01L 29/78* (2006.01)

(56) References Cited

U.S. PATENT DOCUMENTS

| | | |
|---|---|---|
| 7,220,451 B2 | 5/2007 | Aaltonen et al. |
| 2004/0012043 A1 | 1/2004 | Gealy et al. |
| 2005/0235905 A1 | 10/2005 | Senzaki et al. |
| 2007/0262363 A1 | 11/2007 | Tao et al. |
| 2011/0207273 A1 | 8/2011 | Jeong |
| 2014/0027884 A1 | 1/2014 | Tang et al. |
| 2017/0110313 A1 | 4/2017 | Tang et al. |

METHODS FOR FORMING A METAL SILICATE FILM ON A SUBSTRATE IN A REACTION CHAMBER AND RELATED SEMICONDUCTOR DEVICE STRUCTURES

CROSS-REFERENCE TO RELATED APPLICATIONS

This application is a Continuation of, and claims priority to and the benefit of, U.S. patent application Ser. No. 17/873,885, filed Jul. 26, 2022 and entitled "METHODS FOR FORMING A METAL SILICATE FILM ON A SUBSTRATE IN A REACTION CHAMBER AND RELATED SEMICONDUCTOR DEVICE STRUCTURES," which is a Continuation of, and claims priority to and the benefit of, U.S. patent application Ser. No. 17/026,510, filed Sep. 21, 2020 and entitled "METHODS FOR FORMING A METAL SILICATE FILM ON A SUBSTRATE IN A REACTION CHAMBER AND RELATED SEMICONDUCTOR DEVICE STRUCTURES," now U.S. Pat. No. 11,411,088 issued on Aug. 9, 2022, which is a Divisional of, and claims priority to and the benefit of, U.S. patent application Ser. No. 16/194,041, filed Nov. 16, 2018 and entitled "METHODS FOR FORMING A METAL SILICATE FILM ON A SUBSTRATE IN A REACTION CHAMBER AND RELATED SEMICONDUCTOR DEVICE STRUCTURES," now U.S. Pat. No. 10,818,758 issued on Oct. 27, 2020, which are hereby incorporated by reference herein.

FIELD OF INVENTION

The present disclosure relates generally to methods for forming a metal silicate film on a substrate in a reaction chamber by a cyclical deposition process and in particular to methods for forming a metal silicate film utilizing a hydrogen peroxide precursor as the oxidizing agent precursor. The present disclosure is also related generally to semiconductor device structures comprising a metal silicate film deposited by a cyclical deposition process.

BACKGROUND OF THE DISCLOSURE

Metal silicate films, such as, for example, hafnium silicate films ($Hf_xSi_yO_z$), ytrrium silicate films ($Y_xSi_yO_z$), zirconium silicate films ($Zr_xSi_yO_z$), or aluminum silicate films ($Al_xSi_yO_z$), may be utilized for variety of different applications in the field of semiconductor device technologies. As an example, metal silicate films may be used to replace silicon oxide in some applications, such as complementary metal oxide semiconductor (CMOS) applications, because the metal silicate films can offer excellent thermal stability and device performance in semiconductor device structures.

Cyclical deposition processes, such as, for example, atomic layer deposition (ALD) and cyclical chemical vapor deposition (CCVD), sequentially introduce two or more precursors (reactants) into a reaction chamber wherein the precursors react with the surface of the substrate one at a time in a sequential manner. Cyclical deposition processes have been demonstrated which produce metal silicate films with excellent conformality with atomic level thickness control.

Cyclical deposition processes employed to deposit metal silicate films commonly utilize water ($H_2O$) as the oxidizing agent precursor. However, due to the limited reactivity of water ($H_2O$), an alternative oxidizing agent precursor is desirable. Accordingly, methods for forming metal silicate films and related semiconductor device structures including metal silicate films are desirable which utilize an oxidizing agent precursor with enhanced reactivity when compared with common water ($H_2O$) based cyclical deposition processes.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods of forming a metal silicate film on a substrate in a reaction chamber by a cyclical deposition process are provided. The methods may comprise: regulating the temperature of a hydrogen peroxide precursor below a temperature of 70° C. prior to introduction into the reaction chamber; and depositing the metal silicate film on the substrate by performing at least one unit deposition cycle of a cyclical deposition process, wherein a unit deposition cycle comprises: contacting the substrate with a metal vapor phase precursor, contacting the substrate with a silicon vapor phase precursor; and contacting the substrate with the hydrogen peroxide precursor.

In some embodiments, semiconductor device structures are also provided. The semiconductor device structures may comprise: a silicon germanium ($S_{1-x}Ge_x$) channel region; an interface layer comprising an aluminum silicate film disposed directly on the silicon germanium ($S_{1-x}Ge_x$) channel region; and a high-k dielectric material disposed directly on the interface layer; wherein an interface trap density at an interface between the silicon germanium ($S_{1-x}Ge_x$) channel region and the interface layer is less than about $7\ e^{11}\ cm^{-2}\ eV^{-1}$ for mid-gap states.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF EXEMPLARY EMBODIMENTS

Figure 1:
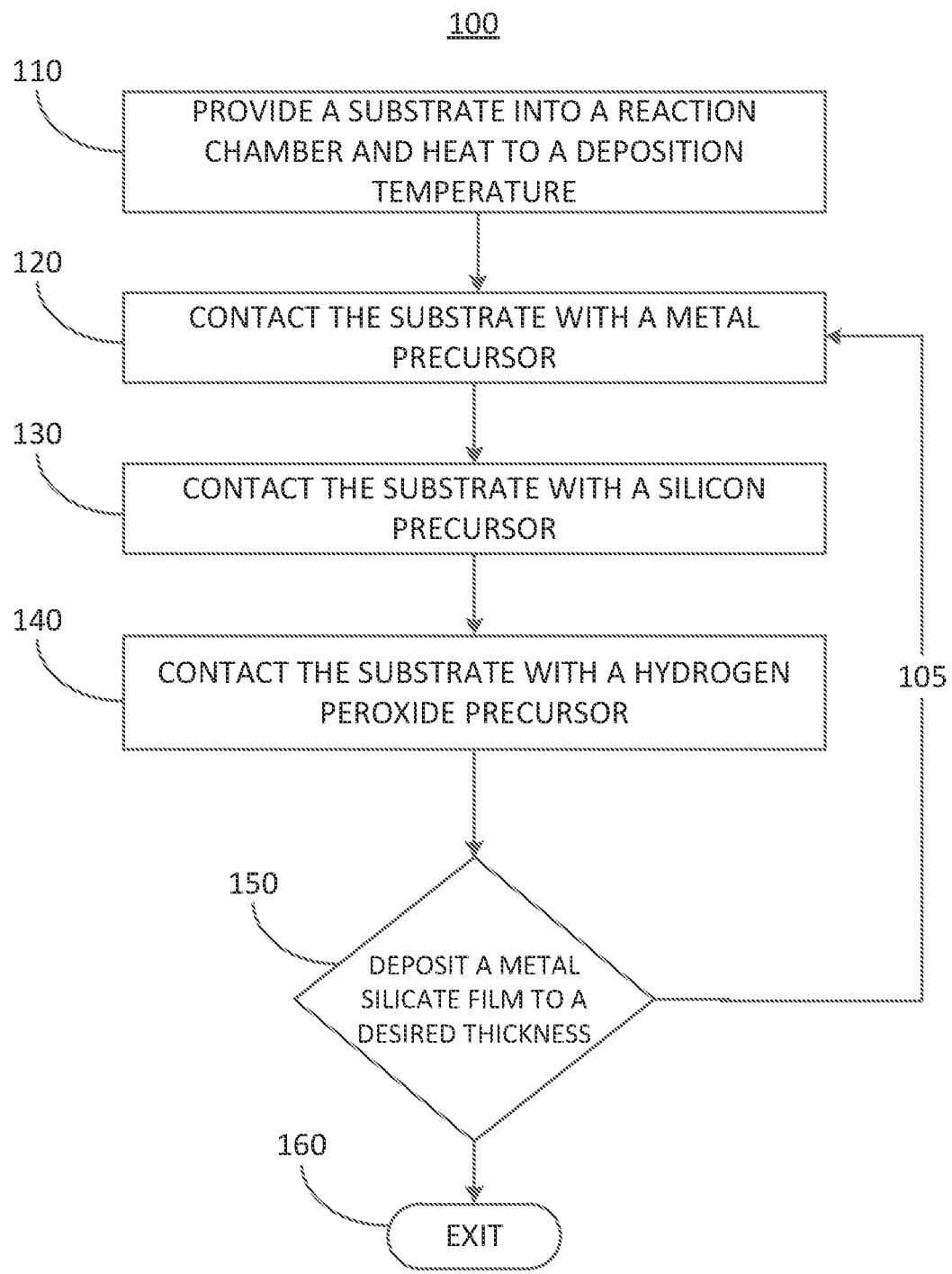
FIG. 1 illustrates a non-limiting exemplary process flow for forming a metal silicate film according to the embodiments of the disclosure.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "cyclic deposition" may refer to the sequential introduction of precursors (reactants) into a reaction chamber to deposit a film over a substrate and includes deposition techniques such as atomic layer deposition and cyclical chemical vapor deposition.

As used herein, the term "cyclical chemical vapor deposition" may refer to any process wherein a substrate is sequentially exposed to two or more volatile precursors, which react and/or decompose on a substrate to produce a desired deposition.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a reaction chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "film" may refer to any continuous or non-continuous structures, material, or materials, deposited by the methods disclosed herein. For example, a "film" could include 2D materials, nanorods, nanotubes, nanolaminates, or nanoparticles or even partial or full molecular layers or partial or full atomic layers or clusters of atoms and/or molecules. A "film" may comprise material(s) or layer(s) with pinholes, but still be at least partially continuous.

As used herein, the term "metal silicate film" may refer to any film including a metal component, a silicon component, and an oxygen component, and may have the general formula $M_xSi_yO_z$ wherein M is the metal component, Si is the silicon component, O is the oxygen component, and x, y and z represent the composition of the metal silicate film.

As used herein, the term "incubation period" may refer to the number of cyclical deposition cycles in the initial stages of a cyclical deposition in which no discernable deposition is observed.

A number of example materials are given throughout the embodiments of the current disclosure, it should be noted that the chemical formulas given for each of the example materials should not be construed as limiting and that the non-limiting example materials given should not be limited by a given example stoichiometry.

The present disclosure includes methods that may be employed for forming a high quality, conformal, metal silicate film. The methods of the current disclosure may employ a cyclical deposition process that utilizes a hydrogen peroxide precursor as the oxidizing agent precursor for the deposition of the metal silicate film. In addition, the temperature of the hydrogen peroxide precursor may be carefully regulated prior to entry into the reaction chamber to prevent premature decomposition of the hydrogen peroxide precursor.

Common cyclical deposition processes for forming metal silicate films have regularly employed water ($H_2O$) as the oxygen precursor. However, even though water ($H_2O$) is the most studied and employed oxygen precursor for metal silicate deposition, there are number of disadvantages to utilizing water as the oxygen precursor for metal silicate deposition. For example, water has limited reactivity and may not be suitable for depositing a high purity metal silicate film. For example, aluminum silicate films deposited utilizing water as the oxygen precursor may have a residual hydrogen content of up to 15 atomic percent, since employing water as the oxygen precursor may introduce both —H and —OH species into the metal silicate film. In addition, water can be easily absorbed on the internal surface of the reaction chamber and the absorbed water may be difficult to remove from the reaction chamber, thereby restricting the semiconductor deposition apparatus that may be utilized when employing water as the oxygen precursor, especially for showerhead-type reactors, for example.

As an alternative to water ($H_2O$), a hydrogen peroxide ($H_2O_2$) precursor may be utilized as the oxygen precursor for metal silicate deposition. There may be a number of benefits of employing a hydrogen peroxide ($H_2O_2$) precursor as the oxygen source for metal silicate deposition. For example, hydrogen peroxide ($H_2O_2$) is more reactive than water and comprises double —OH groups that may produce a more pure metal silicate film. In addition, a hydrogen peroxide ($H_2O_2$) precursor may potentially reduce the chlorine content in metal silicate films deposited utilizing metal chloride precursors at reduced deposition temperatures. Furthermore, a hydrogen peroxide ($H_2O_2$) precursor may be less aggressive than ozone ($O_3$) or oxygen radicals, and has a low diffusivity into the underlying film, thereby substantially limiting the oxidation of the underlying film upon which deposition is being performed.

The embodiments of the disclosure not only utilize hydrogen peroxide as the oxidizing agent precursor, but also regulate the temperature of the hydrogen peroxide precursor prior to entry into the reaction chamber. For example, the temperature of the hydrogen peroxide precursor may regulated to a temperature of less than 70° C. prior to entry into the reaction chamber, thereby preventing premature decomposition of the hydrogen peroxide precursor which could result in the undesirable formation of water in the reaction chamber and associated problems previously discussed related to cyclical deposition processes utilizing water as the oxygen precursor.

Therefore, the embodiments of the disclosure may include methods for forming a metal silicate film on a substrate in a reaction chamber by a cyclical deposition process, the method comprising: regulating the temperature of a hydrogen peroxide ($H_2O_2$) precursor below a temperature of 70° C. prior to introduction into the reaction chamber; and depositing the metal silicate film on the substrate by performing at least one unit deposition cycle of a cyclical deposition process, wherein a unit deposition cycle comprises: contacting the substrate with a metal vapor phase precursor; contacting the substrate with a silicon vapor phase precursor; and contacting the substrate with the hydrogen peroxide precursor.

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different precursor that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

In some embodiments of the disclosure, cyclical deposition methods may be employed to deposit metal silicate films wherein each unit deposition cycle comprises at least three deposition steps or phases and utilizes at least three different precursors or reactants. Although referred to as "the first," "the second," and "the third" precursors, these designations do not imply that the precursors have to be introduced in this order. Thus in some embodiments, the cyclical deposition methods may start with the second precursor, or the third precursor. Similarly, although referred to as first, second, and third phases, they are not necessarily carried out in this sequence. Additionally, each of the phases may be repeated prior to a subsequent phase. Additional phases may also be incorporated into the overall cyclical deposition cycle.

A cyclical deposition process for depositing a metal silicate film may comprise an ALD-type process and a unit deposition cycle may comprise, exposing the substrate to a first precursor, removing any unreacted first precursor and reaction byproducts from the reaction chamber, exposing the substrate to a second precursor, followed by a second removal step, and exposing the substrate to a third precursor, followed by a third removal step. In some embodiments, the first precursor may comprise a metal vapor phase precursor ("the metal precursor"), the second precursor may comprise a silicon vapor phase precursor ("the silicon precursor"), and the third precursor may comprise a hydrogen peroxide precursor ("the oxygen precursor").

Precursors may be separated by inert gases, such as argon (Ar) or nitrogen ($N_2$), to prevent gas-phase reactions between precursors and enable self-saturating surface reactions. In some embodiments, however, the substrate may be moved to separately contact a first precursor, a second precursor, and a third precursor. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

Reactors capable of being used to deposit metal silicate films can be used for the deposition processes described herein. Such reactors include ALD reactors, as well as CVD reactors, configured to provide the precursors. According to some embodiments, a showerhead reactor may be used. According to some embodiments, cross-flow, batch, mini-batch, or spatial ALD reactors may be used.

In some embodiments of the disclosure, a batch reactor may be used. In some embodiments, a vertical batch reactor may be utilized. In other embodiments, the batch reactor comprises a mini-batch reactor configured to accommodate 10 or fewer wafers, 8 or fewer wafers, 6 or fewer wafers, 4 or fewer wafers, or 2 or fewer wafers. In some embodiments in which a batch reactor is used, wafer-to-wafer non-uniformity is less than 3% (1 sigma), less than 2%, less than 1%, or even less than 0.5%.

The deposition processes described herein may optionally be carried out in a reactor or reaction chamber connected to a cluster tool. In a cluster tool, because each reaction chamber is dedicated to one type of process, the temperature of the reaction chamber in each module can be kept constant, which improves the throughput compared to a reactor in which the substrate is heated up to the process temperature before each run. Additionally, in a cluster tool it is possible to reduce the time to pump the reaction chamber to the desired process pressure levels between substrates. In some embodiments of the disclosure, the deposition process may be performed in a cluster tool comprising multiple reaction chambers, wherein each individual reaction chamber may be utilized to expose the substrate to an individual precursor gas and the substrate may be transferred between different reaction chambers for exposure to multiple precursors gases, the transfer of the substrate being performed under a controlled ambient to prevent oxidation/contamination of the substrate.

As a non-limiting example, a first reaction chamber may be utilized to passivate the surface of the substrate by contacting the substrate with a gas-phase sulfur precursor. The passivated substrate may then be transferred to a second reaction chamber under controlled conditions, such as, temperature, pressure, and gaseous environment, and subsequently subjected to a plurality of deposition cycles for depositing a metal silicate film over the passivated substrate surface, the cyclical deposition process being carried out in the second reaction chamber.

A stand-alone reactor may be equipped with a load-lock. In that case, it is not necessary to cool down the reaction chamber between each run. In some embodiments, a deposition process for depositing a metal silicate film may comprise a plurality of deposition cycles, i.e., a plurality of unit cycles, for example, a plurality of ALD cycles or a plurality of cyclical CVD cycles.

In some embodiments, one or more cyclical deposition processes may be used to deposit the metal silicate films of the current disclosure on a substrate and the cyclical deposition processes may comprise one or more ALD-type processes. In some embodiments, a cyclical deposition process may comprise one or more hybrid ALD/CVD processes or one or more cyclical CVD process. For example, in some embodiments, the growth rate of an ALD process may be low compared with a CVD process. One approach to increase the growth rate may be that of operating at a higher substrate temperature than that typically employed in an ALD process, resulting in at least a portion of the deposition being provided by a chemical vapor deposition type process, but still taking advantage of the sequential introduction of precursors, such a process may be referred to as cyclical CVD. In some embodiments, a cyclical CVD process may comprise the introduction of two or more precursors into the reaction chamber wherein there may be a time period of overlap between the two or more precursors in the reaction chamber resulting in both an ALD component of the deposition and a CVD component of the deposition. For example, a cyclical CVD process may comprise the continuous flow of a first precursor and the periodic pulsing of a second precursor and/or a third precursor into the reaction chamber.

As a non-limiting example the metal silicate films of the current disclosure may be deposited by a cyclical deposition process such as exemplary ALD process 100 and its constituent process blocks, as illustrated with reference to FIG. 1. The exemplary ALD process 100 may commence by means of a process block 110 comprising, providing a substrate into a reaction chamber and heating the substrate to a deposition temperature.

In some embodiments of the disclosure, the substrate may comprise a planar substrate or a patterned substrate including high aspect ratio features, such as, for example, trench structures and/or fin structures. The substrate may comprise one or more materials including, but not limited to, silicon (Si), germanium (Ge), germanium tin (GeSn), silicon germanium (SiGe), silicon germanium tin (SiGeSn), silicon carbide (SiC), or a group III-V semiconductor material, such as, for example, gallium arsenide (GaAs), gallium phosphide (GaP), or gallium nitride (GaN). In some embodiments of the disclosure, the substrate may comprise an engineered substrate wherein a surface semiconductor layer is disposed over a bulk support with an intervening buried oxide (BOX) disposed there between.

Patterned substrates may comprise substrates that may include semiconductor device structures formed into or onto a surface of the substrate, for example, a patterned substrate may comprise partially fabricated semiconductor device structures, such as, for example, transistors and/or memory elements. In some embodiments, the substrate may contain monocrystalline surfaces and/or one or more secondary surfaces that may comprise a non-monocrystalline surface, such as a polycrystalline surface and/or an amorphous surface. Monocrystalline surfaces may comprise, for example, one or more of silicon (Si), silicon germanium (SiGe), silicon carbide (SiC), germanium tin (GeSn), germanium (Ge), or a group III-V semiconductor. Polycrystalline or amorphous surfaces may include dielectric materials, such as oxides, oxynitrides or nitrides, such as, for example, silicon oxides and silicon nitrides.

The substrate may be disposed within a suitable reaction chamber, such as ALD reaction chambers and CVD reaction chambers as previously described, and the exemplary ALD process 100 may continue by heating the substrate to a desired deposition temperature prior to film deposition. For example, the substrate may be heated to a substrate temperature of less than approximately 500° C., or less than approximately 400° C., or less than approximately 300° C., or less than approximately 200° C., or even less than approximately 100° C. In some embodiments of the disclosure, the substrate temperature during the deposition process may be between 100° C. and 500° C., or between 200° C. and 300° C.

In addition to achieving a desired deposition temperature, i.e., a desired substrate temperature, the exemplary ALD process 100 may also regulate the pressure within the reaction chamber to obtain desirable characteristics of the metal silicate film. For example, in some embodiments of the disclosure, the exemplary ALD process 100 may be performed within a reaction chamber regulated to a reaction chamber pressure of less than 100 Torr, or less than 10 Torr, or even less than 1 Torr. For example, the exemplary ALD process 100 may be performed within a reaction chamber regulated to a reaction chamber pressure between approximately 1 Torr and approximately 4 Torr.

Upon heating the substrate to a desired deposition temperature and regulating the reaction chamber pressure to a desired set-point, the exemplary ALD process 100 may continue with a cyclical deposition phase 105 by means of a process block 120 comprising, contacting the substrate with a first vapor phase reactant and particularly, in some embodiments, contacting the substrate with a metal vapor phase precursor, i.e., the metal precursor ("the metal stage").

In some embodiments of the disclosure, the metal vapor phase precursor may comprise at least one of a hafnium precursor, an yttrium precursor, a zirconium precursor, an aluminum precursor, a scandium precursor, a cerium precursor, an erbium precursor, or a strontium precursor.

In some embodiments, the metal vapor phase precursor may comprise a metal halide, such as, for example, a metal chloride, a metal iodide, or a metal bromide.

In some embodiments, the metal vapor phase precursor may comprise a metalorganic precursor, including, but not limited to, alky amide based metal precursors, cyclopentadienyl based metal precursors, amidinate based metal precursors, diketonate based metal precursors, or amide based metal precursors.

In some embodiments, a hafnium precursor may comprise at least one of hafnium tetrachloride (HfCl$_4$), or tetrakis-ethylmethylaminohafnium (TEMAHf). In some embodiments, an yttrium precursor may comprise at least one of Y(EtCp)$_3$, tris(methylcyclopentadienyl)yttrium (Y(MeCp)$_3$), tris(N,N'-diisopropylacetamidinato)yttrium (TDIPAY), (Y(THD)$_3$), tris(2,2,6,6-tetramethyl-3,5-octanedionato)yttrium (Y(tmod)$_3$), or tris[N,N-bis(trimethylsilyl)amide]yttrium. In some embodiments, a zirconium precursor may comprise at least one of zirconium tetrachloride (ZrCl$_4$), or tetrakis-ethylmethylaminozirconium (TEMAZr). In some embodiments, a scandium precursor may comprise at least one of tris(cyclopentadienyl)scandium, or tris(methylcyclopentadienyl)scandium. In some embodiments, an erbium precursor may comprise at least one of tris(cyclopentadienyl)erbium, or tris(methylcyclopentadienyl)erbium. In some embodiments, a cerium precursor may comprise tris (cyclopentadienyl)cerium. In some embodiments, a strontium precursor may comprise bis(triisopropylcyclopentadienyl)strontium.

In some embodiments of the disclosure, the metal vapor phase precursor may comprise an aluminum precursor selected from the group comprising: trimethylaluminum (TMA), triethylaluminum (TEA), dimethylaluminumhydride (DMAH), tritertbutylaluminum (TTBA), aluminum trichloride ($AlCl_3$), or dimethylaluminumisopropoxide (DMAI).

In some embodiments of the disclosure, contacting the substrate with the metal vapor phase precursor may comprise contacting the substrate for a time period of between about 0.01 seconds and about 60 seconds, between about 0.05 seconds and about 10 seconds, or between about 0.1 seconds and about 5.0 seconds. In addition, during the contacting of the substrate with the metal vapor phase precursor, the flow rate of the first vapor phase reactant may be less than 2000 sccm, or less than 500 sccm, or even less than 100 sccm. In addition, during the contacting of the substrate with the metal vapor phase precursor the flow rate of the metal vapor phase reactant may range from about 1 to 2000 sccm, from about 5 to 1000 sccm, or from about 10 to about 500 sccm.

The exemplary ALD process 100 of FIG. 1 may continue by purging the reaction chamber. For example, excess metal vapor phase precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess metal vapor phase precursor and any possible reaction byproducts may be removed with the aid of a vacuum, generated by a pumping system in fluid communication with the reaction chamber.

Upon purging the reaction chamber with a purge cycle the exemplary ALD process 100 may continue with a second stage of the cyclical deposition phase 105 by means of a process block 130 which comprises, contacting the substrate with a second vapor phase precursor, and particularly contacting the substrate with a silicon vapor phase precursor ("the silicon stage").

In some embodiments of the disclosure, the silicon vapor phase precursor may be selected from the group comprising: silanediamine N,N,N',N-tetraethyl($C_8H_{22}N_2Si$), BTBAS (bis(tertiarybutylamino)silane), BDEAS (bis(diethylamino) silane), TDMAS (tris(dimethylamino)silane), hexakis(ethylamino)disilane ($Si_2(NHC_2H_5)_6$), hexachlorodisilane (HCDS), or pentachlorodisilane(PCDS).

In some embodiments, the silicon vapor phase precursor may comprise a silane, such as, for example, silane ($SiH_4$), disilane ($Si_2H_8$), trisilane ($Si_3H_8$), tetrasilane ($Si_4H_{10}$) or higher order silanes with the general empirical formula $Si_xH_{(2x+2)}$.

In some embodiments, the silicon vapor phase precursor may comprise a silicon halide compound, such as, for example, a silicon halide having the general formula given as: $Si_xW_yH_z$, wherein "W" is a halide selected from the group consisting of Fluorine (F), Chlorine (Cl), Bromine (Br), and Iodine (I), "x" and "y" are integers greater than zero, and "z" is an integer greater than or equal to zero. In some embodiments, the silicon halide precursor may be selected from the group consisting of silicon fluorides (e.g., $SiF_4$), silicon chlorides (e.g., $SiCl_4$), silicon bromides (e.g., $SiBr_4$), and silicon iodides (e.g., $SiI_4$). In some embodiments, the silicon vapor phase precursor may comprise silicon tetrachloride ($SiCl_4$).

In some embodiments, the silicon vapor phase precursor may comprise an aminosilane, such as, bis-ethylaminosilane, for example.

In some embodiments of the disclosure, contacting the substrate with the silicon vapor phase precursor may comprise contacting the silicon precursor to the substrate for a time period of between about 0.01 seconds and about 60 seconds, between about 0.05 seconds and about 10 seconds, or between about 0.1 seconds and about 5.0 seconds. In addition, during the contacting of the substrate with the silicon precursor, the flow rate of the silicon precursor may be less than 2000 sccm, or less than 500 sccm, or even less than 100 sccm. In addition, during the contacting of the substrate with the silicon precursor the flow rate of the silicon precursor may range from about 1 to 2000 sccm, from about 5 to 1000 sccm, or from about 10 to about 500 sccm.

Upon contacting the substrate with the silicon vapor phase precursor, the exemplary ALD process 100 may proceed by purging the reaction chamber. For example, excess silicon precursor and reaction byproducts (if any) may be removed from the surface of the substrate, e.g., by pumping whilst flowing an inert gas. In some embodiments of the disclosure, the purge process may comprise purging the substrate surface for a time period of between approximately 0.1 seconds and approximately 10 seconds, or between approximately 0.5 seconds and approximately 3 seconds, or even between approximately 1 second and 2 seconds.

Upon purging the reaction chamber with a purge cycle, the exemplary ALD process 100 may continue with a third stage of the cyclical deposition phase 105 by means of a—process block 140 which comprises, contacting the substrate with a third vapor phase reactant, and particularly contacting the substrate with hydrogen peroxide ($H_2O_2$) ("the oxygen stage").

In some embodiments, the temperature of the hydrogen peroxide precursor may be carefully regulated prior to entering the reaction chamber thereby preventing premature decomposition of the hydrogen peroxide precursor. In some embodiments of the disclosure, the reaction chamber may comprise a showerhead reactor utilizing a showerhead gas distribution mechanism to introduce the precursors, and particularly the hydrogen peroxide precursor, into the reaction chamber. In some embodiments, the methods of the current disclosure may comprise regulating the temperature of the showerhead distribution mechanism to a temperature below 70° C., or below 60° C., or even below 50° C. In some embodiments, the temperature of the showerhead distribution mechanism may be regulated to a temperature between approximately 50° C. and approximately 120° C.

In some embodiments, in addition to the temperature regulation of the showerhead gas distribution mechanism the temperature of the chamber walls of the reaction chamber walls may also be regulated to prevent premature decomposition of the hydrogen peroxide precursor. For example, in some embodiments, the reaction chamber may comprise a "cold-wall" reaction chamber, wherein the temperature of the chamber walls is maintained below that of the deposition temperature of the substrate. Therefore, in some embodiments, the methods of the current disclosure may further comprise regulating the temperature of at least one chamber wall of the reaction chamber at least at those portions of the least one chamber wall exposed to the precursors, and particularly to the hydrogen peroxide precursor, to a temperature below 70° C., or below 60° C., or even below 50° C. In some embodiments, the temperature of at least one chamber wall of the reaction chamber may be regulated at a temperature between approximately 50° C. and approximately 120° C.

For more detailed information on temperature regulation of a showerhead gas distribution mechanism and temperature regulation of the chamber walls of a reaction chamber, see U.S. application Ser. No. 15/636,307, filed on Jun. 28, 2017, titled "METHODS FOR DEPOSITING A TRANSITION METAL NITRIDE FILM ON A SUBSTRATE BY ATOMICLAYER DEPOSITION AND RELATED DEPOSITION APPARATUS," all of which is hereby incorporated by reference.

The careful regulation of the temperature of the showerhead gas distribution mechanism and the chamber walls of the reaction chamber may substantially prevent the premature decomposition of the hydrogen peroxide precursor prior to interaction with the heated substrate. Therefore, in some embodiments, the hydrogen peroxide precursor may decompose proximate to the substrate.

In some embodiments of the disclosure, contacting the substrate with the hydrogen peroxide precursor may comprise, contacting the substrate with the hydrogen peroxide precursor for a time period of between about 0.01 seconds and about 60 seconds, between about 0.05 seconds and about 10 seconds, or between about 0.1 seconds and about 5.0 seconds. In addition, during the contacting of substrate with the hydrogen peroxide precursor, the flow rate of the hydrogen peroxide precursor may be less than 2000 sccm, or less than 500 sccm, or even less than 100 sccm. In addition, during the contacting the substrate with the hydrogen peroxide precursor the flow rate of the hydrogen peroxide precursor may range from about 1 to 2000 sccm, from about 5 to 1000 sccm, or from about 10 to about 500 sccm.

Upon contacting the substrate with the hydrogen peroxide precursor, the exemplary ALD process 100 may proceed by purging the reaction chamber. For example, excess hydrogen peroxide precursor and reaction byproducts (if any) may be removed from the surface of the substrate, e.g., by pumping whilst flowing an inert gas. In some embodiments of the disclosure, the purge process may comprise purging the substrate surface for a time period of between approximately 0.1 seconds and approximately 10 seconds, or between approximately 0.5 seconds and approximately 3 seconds, or even between approximately 1 second and 2 seconds.

Upon completion of the purge of the third vapor phase reactant, i.e., the hydrogen peroxide precursor (and any reaction byproducts) from the reaction chamber, the cyclic deposition phase 105 may continue by means of a decision gate 150, wherein the decision gate 150 is dependent on the thickness of the metal silicate film deposited. For example, if the metal silicate film is deposited at an insufficient thickness for a desired application, then the cyclical deposition phase 105 may be repeated by returning to the process block 120 and continuing through a further deposition cycle, wherein a unit deposition cycle may comprise, contacting the substrate with a metal precursor (process block 120), purging the reaction chamber, contacting the substrate with a silicon precursor (process block 130), purging the reaction chamber, contacting the substrate with a hydrogen peroxide precursor (process block 140), and again purging the reaction chamber. A unit deposition cycle of cyclical deposition phase 105 may be repeated one or more times until a desired thickness of a metal silicate film is deposited over the substrate. Once the metal silicate film has been deposited to the desired thickness the exemplary ALD process 100 may exit via a process block 160 and the substrate, with the metal silicate film thereon, may be subjected to further processing for the formation of a semiconductor device structure.

It should be appreciated that in some embodiments of the disclosure, the order of contacting of the substrate with the metal precursor, the silicon precursor, and the hydrogen peroxide precursor may be such that the sequence of contacting the substrate with the different precursors may be carried out in any order within a unit deposition cycle. As a non-limiting example, the substrate may be first contacted with the hydrogen peroxide precursor, followed by the metal precursor, and subsequently by the silicon precursor. In addition, in some embodiments, the cyclical deposition phase 105 of exemplary ALD process 110 may comprise, contacting the substrate with each individual precursor one or more time prior to progressing to the next stage of the deposition cycle. For example, a unit deposition cycle may incorporate multiple pulses of the metal precursor, and/or the silicon precursor, and/or the hydrogen peroxide precursor.

In some embodiments of the disclosure, the growth rate of the metal silicate film may be from about 0.005 Å/cycle to about 5 Å/cycle, or from about 0.01 Å/cycle to about 2.0 Å/cycle, or from about 0.1 Å/cycle to about 1.5 Å/cycle. In some embodiments of the disclosure, the growth rate of the metal silicate film is approximately 1.0 Å/cycle.

In some embodiments of the disclosure, the metal silicate films may be deposited on the surface of the substrate substantially without, or without, an incubation period. In more detail, prior cyclical deposition processes utilized for the deposition of metal silicate films generally require a plurality of deposition cycles prior to any discernable deposition on the surface of the substrate. In contrast, the embodiments of the current disclosure which utilize a hydrogen peroxide precursor as the oxidizing agent with stringent temperature control over the hydrogen peroxide precursor prior to interaction with the heated substrate, results in immediate deposition of the metal silicate film upon the substrate surface from the initial deposition cycle thereby eliminating any incubation period. For example, deposition of a metal silicate film may be achieved on the substrate utilizing less than 10 deposition cycles, or less than 5 deposition cycles, or less than 2 deposition cycles, or even 1 deposition cycle.

The metal silicate films deposited by the cyclical deposition processes disclosed herein may be continuous films. In some embodiments, the metal silicate film may be continuous at a thickness below approximately 100 nanometers, or below approximately 60 nanometers, or below approximately 50 nanometers, or below approximately 40 nanometers, or below approximately 30 nanometers, or below approximately 20 nanometers, or below approximately 10 nanometers, or below approximately 5 nanometers, or below approximately 2 nanometers, or below approximately 1 nanometer, of even below approximately 0.5 nanometers. The continuity referred to herein can be physical continuity or electrical continuity. In some embodiments of the disclosure the thickness at which the metal silicate film may be physically continuous may not be the same as the thickness at which the metal silicate film is electrically continuous, and vice versa.

In some embodiments of the disclosure, the metal silicate films deposited according to the cyclical deposition processes described herein may have a thickness from about 20 nanometers to about 100 nanometers, or about 20 nanometers to about 60 nanometers. In some embodiments, a metal silicate film deposited according to some of the embodiments described herein may have a thickness greater than about 20 nanometers, or greater than about 30 nanometers, or greater than about 40 nanometers, or greater than about 50 nanometers, or greater than about 60 nanometers, or greater than about 100 nanometers, or greater than about 250 nanometers, or greater than about 500 nanometers, or greater. In some embodiments a metal silicate film deposited according to some of the embodiments described herein may have a thickness of less than about 50 nanometers, or less than about 30 nanometers, or less than about 20 nanometers, or less than about 15 nanometers, or less than about 10 nanometers, or less than about 5 nanometers, or less than about 3 nanometers, or less than about 2 nanometers, or even less than about 1 nanometer.

The cyclical deposition processes, such as the exemplary ALD processes described herein, may be utilized to deposit metal silicate films with a greater purity than those formed by prior deposition methods. As a non-limiting example, the metal silicate films of the current disclosure may comprise less than about 1 atomic-% carbon, or less than 0.5 atomic-% carbon, or less than 0.2 atomic-% carbon. As a further non-limiting example, the metal silicate films of the current disclosure may comprise less than about 5 atomic-% hydrogen, or less than 4 atomic-% hydrogen, or even less than 3 atomic-% hydrogen. In the embodiments outlined herein, the atomic concentration of an element may be determined utilizing Rutherford backscattering (RBS).

In some embodiments of the disclosure, the metal silicate films of the current disclosure may be deposited utilizing a halide precursor, e.g., silicon tetrachloride ($SiCl_4$) as the silicon precursor, and the deposition methods of the current disclosure may enable the deposition of metal silicate films with a reduced residual halide content. For example, the metal silicate films of the current disclosure may comprise less than about 0.2 atomic-% halide, or less than about 0.1 atomic-% halide, or less than 0.05 atomic-% halide, wherein the halide may comprise at least one of fluorine (F), chlorine (Cl), bromine (Br), or iodine (I). As a non-limiting example, the metal silicate film of the current disclosure may be deposited utilizing a silicon chloride precursor (e.g., $SiCl_4$) and the metal silicate films may comprise less than 0.2 atomic-% chlorine, or less than about 0.1 atomic-% chlorine, or even less than about 0.05% atomic % chlorine.

The embodiments of the disclosure may be employed for forming high quality metal silicate films and particular metal silicate films from the group comprising: hafnium silicate films ($Hf_xSi_yO_z$), yttrrium silicate films ($Y_xSi_yO_z$), zirconium silicate films ($Zr_xSi_yO_z$), aluminum silicate films ($Al_xSi_yO_z$), scandium silicate films ($Sc_xSi_yO_z$), cerium silicate films ($Ce_xSi_yO_z$), erbium silicate films ($Er_xSi_yO_z$), or strontium silicate films ($Sr_xSi_yO_z$).

In some embodiments of the disclosure, the metal silicate films of the current disclosure may comprises a silicon content of greater than approximately 10 atomic-%, or greater than approximately 20 atomic-%, or greater than approximately 30 atomic-%, or greater than approximately 40 atomic-%, or greater than approximately 50 atomic-%, or even greater than approximately 60 atomic-%. In some embodiments, the metal silicate films of the current disclosure may have a silicon content between approximately 10 atomic-% and approximately 60 atomic %, or between approximately 10 atomic-% and approximately 30 atomic-%. In some embodiments, the metal silicate films of the current disclosure may have a silicon content of less than 10 atomic-%.

As a non-limiting example, the metal silicate film of the current disclosure may comprise an aluminum silicate film ($Al_xSi_yO_z$) with an atomic percentage of silicon between approximately 10 atomic-% and approximately 60 atomic-%. As a further non-limiting example, the metal silicate film of the current disclosure may comprise an aluminum silicate film ($Al_xSi_yO_z$) with an atomic percentage of silicon between approximately 10 atomic-% and approximately 30 atomic-%, or an atomic percentage of silicon less than 10 atomic-%.

In some embodiments of the disclosure, the metal silicate films may be deposited on a three-dimensional structure, e.g., a non-planar substrate comprising high aspect ratio features. In some embodiments, the step coverage of the metal silicate film may be equal to or greater than about 50%, or greater than about 60%, or greater than 70%, or greater than 80%, or greater than about 90%, or greater than about 95%, or greater than about 98%, or greater than about 99%, or greater in structures having aspect ratios (height/width) of more than about 2, or more than about 5, or more than about 10, or more than about 25, or more than about 50, or even more than about 100.

As previously stated, the substrate upon which the metal silicate film is deposited may comprise a patterned substrate that may include semiconductor device structures formed into or onto a surface of the substrate, for example, a patterned substrate may comprise partially fabricated semiconductor device structures, such as, for example, transistors and/or memory elements.

In some embodiments of the disclosure, the substrate may comprise a plurality of channel regions and the metal silicate film may be deposited directly on the plurality of channel regions, wherein the term "channel region" may refer to a region of a semiconductor device structure in which carrier flow may be controlled, e.g., by biasing of a gate electrode.

Figure 2:
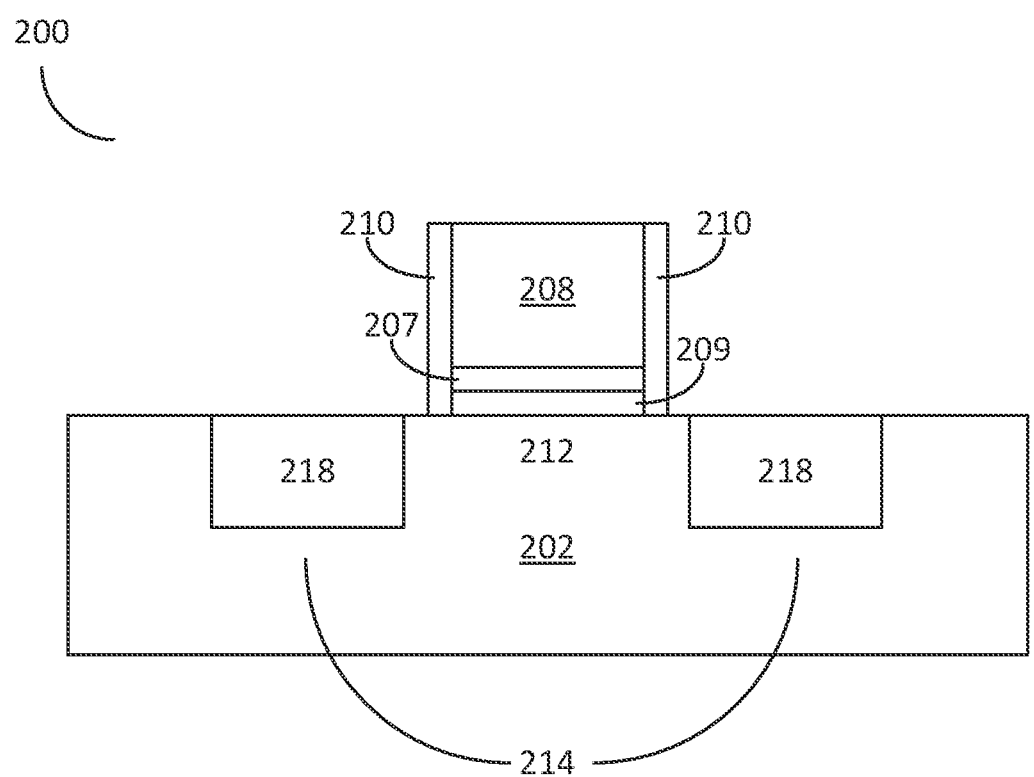
FIG. 2 illustrates a non-limiting exemplary semiconductor device structure including a metal silicate film formed according to the embodiments of the disclosure.

As a non-limiting example, FIG. 2 illustrates semiconductor device structure 200, which may comprise a planar NMOS FET device. Semiconductor device structure 200 may include a substrate 202, which may include p-type dopants. Disposed in the or on the substrate are source/drain regions 214, the source/drain regions 214 comprising a phosphorus doped silicon film 218. A channel region 212 may be disposed between the source/drain regions 214. Although a single channel region 212 is illustrated in FIG. 2 it should be appreciated that the substrate upon which deposition of the metal silicate is performed may comprise a plurality of channel regions. In some embodiments, the plurality of channels regions may comprise silicon germanium ($Si_{1-x}Ge_x$) wherein x may be between approximately 0 and approximately 0.25, or between approximately 0 and approximately 0.50, or between approximately 0.01 and approximately 0.50, or even between 0.05 and approximately 0.25.

In some embodiments of the disclosure, an interface layer 209 comprising a metal silicate may be disposed directly on the channel region 212 and the metal silicate interface layer 209 may be deposited directly on the channel region utilizing the cyclical deposition processes described herein. For example, the metal silicate interface layer 209 may comprise an aluminum silicate ($Al_xSi_yO_z$) with an atomic percentage of silicon between approximately 10 atomic-% and approximately 60 atomic-%, or between approximately 10 atomic % and approximately 30 atomic-%, or less than approximately 10 atomic-%.

In some embodiments of the disclosure, prior to the deposition of the metal silicate film directly on the plurality of channels regions, the exposed surface of the plurality of the channels regions may be passivated. In more detail, the interface between the interface layer 209 and the channel region 212 commonly includes a large interface trap density ($D_{it}$). The high $D_{it}$ values are thought to result from vacancies and dangling bonds at the surface of the channel region comprising a silicon germanium material and may deleteriously affect the performance of semiconductor devices formed utilizing the plurality of silicon germanium channel regions.

Therefore, the embodiments of the disclosure further comprise, passivating a surface of the plurality of channel regions prior to deposition of the metal silicate film, wherein passivating the surface of the plurality of channels regions comprises, exposing the exposed surface of the plurality of channel regions to a gas-phase sulfur precursor. In some embodiments, the gas-phase sulfur precursor may comprise at least one of $(NH_4)_2S$, $H_2S$, $NH_4HS$, or an organosulfur compound. More information related to the passivation of semiconductor channel region utilizing a gas-phase sulfur precursor may found in U.S. Publication No. 2014/0027884, filed on Jul. 12, 2013, titled "SYSTEM AND METHOD FOR GAS-PHASE SULFUR PASSIVATION OF A SEMICONDUCTOR SURFACE," all of which is hereby incorporated by reference.

In some embodiments, the interface trap density at an interface between the plurality of channel regions, such as channel region 212, and the metal silicate film, i.e., the interface layer 209, is less than $7\ e^{12}\ cm^{-2}\ eV^{-1}$, or less than $1\ e^{12}\ cm^{-2}\ eV^{-1}$, or even less than $7\ e^{11}\ cm^{-2}\ eV^{-1}$ for mid-gap states. In addition, in some embodiments, the metal silicate film, i.e., the interface layer 209, may have an effective oxide charge density of less than $5\ e^{10}\ cm^{-2}$, or less than $3\ e^{10}\ cm^{-2}$, or even less than $2\ e^{10}\ cm^{-2}$.

In some embodiments, the methods of the disclosure may further comprise depositing a high-k dielectric material on the metal silicate film, such that the metal silicate film forms an interface layer disposed directly between the plurality of channel regions and the high-k dielectric material. For example, the semiconductor device structure 200 may comprise a high-k dielectric material 207 disposed directly on the metal silicate interface layer 209. In some embodiments, the high-k dielectric material 207 may comprise a metallic oxide having a dielectric constant greater than approximately 7. In some embodiments, the high-k metallic oxide may comprise at least one of hafnium oxide ($HfO_2$), tantalum oxide ($Ta_2O_5$), zirconium oxide ($ZrO_2$), titanium oxide ($TiO_2$), hafnium silicate ($HfSiO_x$), aluminum oxide ($Al_2O_3$) or lanthanum oxide ($La_2O_3$), or mixtures/laminates thereof.

A gate electrode may be deposited directly on the high-k dielectric material, such as gate electrode 208 disposed directly on the high-k dielectric material 207. In some embodiments, the gate electrode may comprise one or more of a metal, a metal nitride, or a metal carbide film, such as, for example, a titanium aluminum carbide (TiAlC). In addition, gate spacers 210 may be disposed over the substrate 202.

The embodiments of the disclosure may also provide semiconductor device structures, such as, for example, the semiconductor device structure 200 of FIG. 2. The semiconductor device structure may comprise, a silicon germanium ($S_{1-x}Ge_x$) channel region 212, an interface layer 209 comprising an aluminum silicate film disposed directly on the silicon germanium ($S_{1-x}Ge_x$) channel region 212; and a high-k dielectric material 207 disposed directly on the interface layer, wherein an interface trap density at an interface between the silicon germanium ($S_{1-x}Ge_x$) channel region 212 and the interface layer 209 is less than about $7\ e^{11}\ cm^{-2}\ eV^{-1}$ for mid-gap states.

In some embodiments of the disclosure, the silicon germanium ($S_{1-x}Ge_x$) channel region 212 has germanium content wherein x is between approximately 0 and approximately 0.50, or between approximately 0 and approximately 0.25, or between approximately 0.01 and approximately 0.50, or between approximately 0.05 and approximately 0.25. In addition, the aluminum silicate film 209 may have an atomic percentage of silicon between approximately 10 atomic-% and approximately 60 atomic-%, or between approximately 10 atomic % and approximately 30 atomic-%, or even less than 10 atomic-%. In some embodiments, the aluminum silicate film 209 may have an effective oxide charge density of less than $5\ e^{10}\ cm^{-2}$. In addition, the interface layer comprising the aluminum silicate film 209 may have a thickness of less than 1 nanometer, or less than 0.5 nanometers, or even less than 0.25 nanometers.

In some embodiments, the high-k dielectric material 207 may comprise a metallic oxide having a dielectric constant greater than approximately 7. In addition, a gate electrode 208 may be disposed over the high-k dielectric material 207 and gate spacers 210 may be disposed over the substrate 202.

Figure 3:
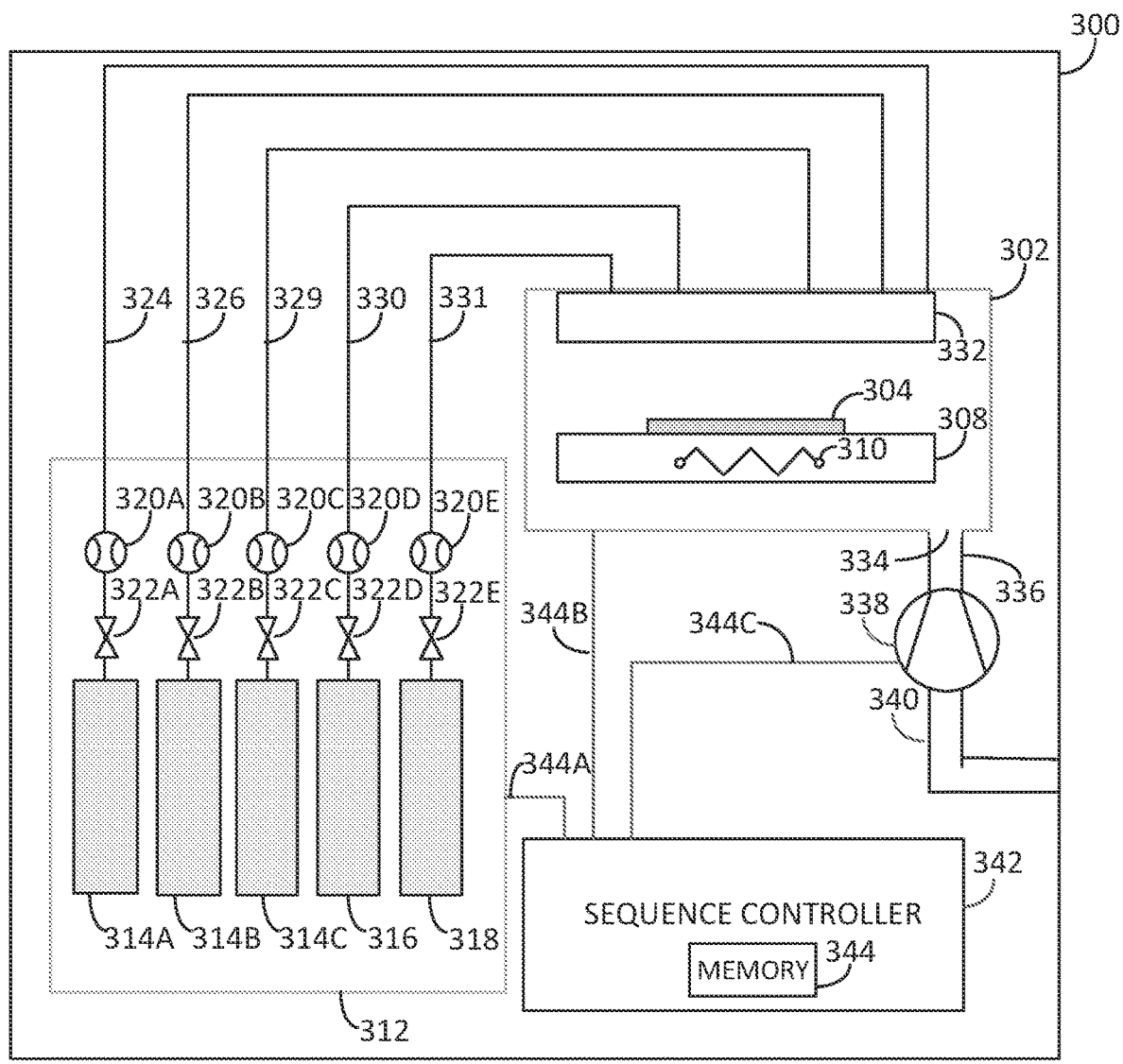
FIG. 3 illustrates a non-limiting exemplary semiconductor processing apparatus which may be utilized to form a metal silicate film according to the embodiments of the disclosure.

The embodiments of the disclosure may also provide semiconductor processing apparatus configured for performing the cyclical deposition methods described herein. In more detail, FIG. 3 illustrates an exemplary semiconductor processing apparatus 300 which comprises a reaction chamber 302 and a precursor delivery system 312. The precursor delivery system 312 may be configured for supplying precursor(s) and purge gas to the reaction chamber 302. It should be noted that the semiconductor processing apparatus 300 is a simplified schematic version of an exemplary semiconductor processing apparatus and does not contain each and every element, i.e., such as each and every valve, gas line, heating element, and reactor component, etc. The semiconductor processing apparatus 300 of FIG. 3 provides the key features of the apparatus to provide sufficient disclosure to one of ordinary skill in the art.

The exemplary semiconductor processing apparatus 300 may comprise a reaction chamber 302 constructed and arranged to hold at least a substrate 304. In some embodiments, the reaction chamber 302 may be configured for one or more of a deposition process, an etching process, or a cleaning process. For example, the reaction chamber 302 may be configured for cyclical deposition processes, such as, for example, atomic layer deposition (ALD) processes, or cyclical chemical vapor deposition (CCVD) processes. In some embodiments, the reaction chamber may include one or more temperature controlled chamber walls wherein the chamber walls may be regulated at a temperature below approximately 70° C., such a regulation of the chamber walls may prevent premature decomposition of the hydrogen peroxide precursor utilized in the cyclical deposition processes of the current disclosure and further details regarding the temperature control of reaction chamber walls may be found in U.S. application Ser. No. 15/636,307, filed on Jun. 28, 2017, titled "METHODS FOR DEPOSITING A TRANSITION METAL NITRIDE FILM ON A SUBSTRATE BY ATOMIC LAYER DEPOSITION AND RELATED DEPOSITION APPARATUS," all of which is hereby incorporated by reference.

In some embodiments, the substrate 304 may be disposed in the reaction chamber 302 and held in position by a susceptor 308 configured to retain at least one substrate thereon. The susceptor may comprise a heater 310 configured to heat the substrate 304 to a suitable process temperature.

The precursor delivery system 312 may comprise one or more precursor sources 314A, 314B, and 314C constructed and arranged to provide a vapor phase precursor to the reaction chamber 302. For example, the precursor sources 314A, 314B, and 314C may comprise a solid precursor, a liquid precursor, a vapor precursor, or mixtures thereof. In some embodiments, the precursor source 314A may comprise a metal vapor phase precursor, such as, an aluminum precursor (e.g., trimethylaluminum (TMA)). In some embodiments, the precursor source 314B may comprise a silicon vapor phase precursor, such as, a silicon halide (e.g., silicon tetrachloride ($SiCl_4$)). In some embodiments, the precursor source 314C may comprise a hydrogen peroxide ($H_2O_2$) precursor.

The precursor delivery system 312 may also comprise a source vessel 316 configured for storing and dispensing a purge gas to the reaction chamber 302, such as, for example, nitrogen, helium, or argon. The precursor delivery system 312 may also comprise a source vessel 318 configured for storing and dispensing a gas-phase sulfur precursor to the reaction chamber 302 to enable passivation of surfaces of the substrate 304 disposed within the reaction chamber 302, such as, hydrogen sulfide ($H_2S$), for example.

The precursor delivery system 312 may also comprise valves 322A, 322B, 322C, 322D, and 322E, e.g., shut-off valves, which may be associated with the precursor sources 314A, 314B, and 314C, as well the source vessel 316 containing purge gas, and the source vessel 318 containing a gas-phase sulfur precursor. The valves 322A, 322B, 322C, 322D, and 322E, may be utilized to disengage the precursor sources, purge gas source, and gas-phase sulfur precursor sources from the reaction chamber 302, i.e., when the one of more valves are in the closed position vapor produced by the sources may be prevented from flowing into the reaction chamber 302.

The precursor delivery system 312 may further comprise flow controllers 320A, 320B, 320C, 320D and 320E, configured for monitoring and regulating the mass flow of the precursors and purge gas into the reaction chamber 302. For example, the flow controllers 320A, 320B, 320C, 320D, and 320E may comprise mass flow controllers (MFCs).

One or more gas lines, such as gas lines 324, 326, 329, 330, and 331, may be in fluid communication with both the precursor/purge sources and the reaction chamber 302 to enable the supply of vapors to the reaction chamber 302. In particular embodiments, the precursor delivery system 312 may be in fluid communication with a gas dispenser 332 configured for dispensing precursor vapor and purge gas into the reaction chamber 302 and over the substrate 304. As a non-limiting example, the gas dispenser 332 may comprise a showerhead gas distribution mechanism as illustrated in block form in FIG. 3. It should be noted that the although shown in block form, the showerhead gas distribution mechanism may be a relatively complex structure and may configured for either mixing vapors from multiple sources, or maintaining a separation between multiple vapors introduced into the showerhead gas distribution mechanism. In addition, in exemplary embodiments, the gas dispenser may comprise a showerhead gas distribution mechanism configured to introduce the precursors into the reaction chamber wherein the temperature of the showerhead gas distribution mechanism is regulated below a temperature of 70° C. Further details regarding the temperature regulation of a showerhead gas distribution mechanism may be found in U.S. application Ser. No. 15/636,307, filed on Jun. 28, 2017, titled "METHODS FOR DEPOSITING A TRANSITION METAL NITRIDE FILM ON A SUBSTRATE BY ATOMIC LAYER DEPOSITION AND RELATED DEPOSITION APPARATUS," all of which is hereby incorporated by reference.

The exemplary semiconductor processing apparatus 300 may also comprise a gas removal system constructed and arranged to remove gases from the reaction chamber 302. For example, the removal system may comprise an exhaust port 334 disposed within a wall of the reaction chamber 302, an exhaust line 336 in fluid communication with the exhaust port 334, and a vacuum pump in fluid communication with the exhaust line 336 and configured for evacuating gases from within the reaction chamber 302. Once the gases have been exhausted from the reaction chamber 302 utilizing the vacuum pump 338, they may be conveyed along additional exhaust line 340 and exit the apparatus 300 where they may undergo further abatement processes.

The exemplary semiconductor processing apparatus 300 may further comprising a sequence controller 342 operably connected to the precursor delivery system 312, the reaction chamber 302, and the removal system by means of exemplary control lines 344A, 344B, and 344C. The sequence controller 342 may comprise electronic circuitry to selectively operate valves, heaters, flow controllers, manifolds, pumps and other equipment associated with the semiconductor processing apparatus 300. Such circuitry and components operate to introduce precursor gases and purge gases from sources 314A, 314B, 314C, 316, and 318. The sequence controller 342 may also control the timing of precursor pulse sequences, temperature of the substrate and reaction chamber, and the pressure of the reaction chamber and various other operations necessary to provide proper operation of the semiconductor processing apparatus 300. The sequence controller 342 may also comprise a memory 344 provided with a program to execute semiconductor processes when run on the sequence controller 342. For example, the sequence controller 342 may include modules such as software or hardware components (e.g., FPGA or ASIC) which perform certain semiconductor processes, such as, for example, etching processes, cleaning processes, and/or particularly cyclical deposition processes. A module can be configured to reside on an addressable storage medium of the sequence controller 342 and may be configured to execute one or semiconductor processes.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:
1. A semiconductor processing apparatus, comprising:
  a reaction chamber configured to hold a substrate, the reaction chamber including at least one chamber wall;
  a precursor delivery system in fluid communication with the reaction chamber; and
  a controller operably connected to at least one of the reaction chamber or the precursor delivery system and comprising a storage medium having instructions stored thereon configured to perform operations including:
regulating a temperature of a first precursor below a temperature of 70° C.; and
depositing the metal silicate film on the substrate by performing at least one unit deposition cycle of a cyclical deposition process, wherein a unit deposition cycle comprises:
contacting the substrate with a metal vapor phase precursor from the precursor delivery system;
contacting the substrate with a silicon vapor phase precursor from the precursor delivery system; and
contacting the substrate with a hydrogen peroxide precursor from the precursor delivery system,
wherein the first precursor is at least one of the metal vapor phase precursor, the silicon vapor phase precursor, or the hydrogen peroxide precursor.

2. The apparatus of claim 1, wherein the regulating the temperature of the first precursor below a temperature of 70° C. comprises regulating the temperature of the first precursor below a temperature of 70° C. prior to introduction into the reaction chamber.

3. The apparatus of claim 1, further comprising a gas dispenser coupled to the reaction chamber in fluid communication with the precursor delivery system.

4. The apparatus of claim 3, wherein the operations further comprise regulating a temperature of the gas dispenser below a temperature of 70° C.

5. The apparatus of claim 4, wherein the regulating the temperature of the first precursor below a temperature of 70° C. comprises regulating the temperature of the first precursor below a temperature of 70° C. during flow through the gas dispenser.

6. The apparatus of claim 1, wherein the precursor delivery system comprises:
a metal precursor source in fluid communication with the reaction chamber for providing the metal vapor phase precursor;
a silicon precursor source in fluid communication with the reaction chamber for providing the silicon vapor phase precursor; and
a hydrogen peroxide precursor source in fluid communication with the reaction chamber for providing the hydrogen peroxide precursor.

7. The apparatus of claim 1, wherein in at least a portion of the at least one chamber wall is temperature-controlled.

8. The apparatus of claim 7, wherein the regulating the temperature of the first precursor below a temperature of 70° C. comprises regulating the temperature of the first precursor in the reaction chamber.

9. The apparatus of claim 1, wherein the operations further comprise repeating the unit deposition cycle two or more times.

10. The apparatus of claim 1, wherein the metal silicate film comprises an atomic percentage of silicon between approximately 10 atomic-% and approximately 60 atomic-%.

11. A semiconductor processing apparatus, comprising:
a reaction chamber configured to hold a substrate, the reaction chamber including at least one chamber wall;
a precursor delivery system in fluid communication with the reaction chamber; and
a controller operably connected to at least one of the reaction chamber or the precursor delivery system and comprising a storage medium having instructions stored thereon configured to perform operations including:
regulating a temperature of a hydrogen peroxide precursor below a temperature of 70° C.; and
depositing the metal silicate film on the substrate by performing at least one unit deposition cycle of a cyclical deposition process, wherein a unit deposition cycle comprises:
contacting the substrate with a metal vapor phase precursor from the precursor delivery system;
contacting the substrate with a silicon vapor phase precursor from the precursor delivery system; and
contacting the substrate with the hydrogen peroxide precursor from the precursor delivery system.

12. The apparatus of claim 11, wherein the regulating the temperature of the hydrogen peroxide precursor below a temperature of 70° C. comprises regulating the temperature of the hydrogen peroxide precursor below a temperature of 70° C. prior to introduction into the reaction chamber.

13. The apparatus of claim 11, further comprising a gas dispenser coupled to the reaction chamber in fluid communication with the precursor delivery system.

14. The apparatus of claim 13, wherein the operations further comprise regulating a temperature of the gas dispenser below a temperature of 70° C.

15. The apparatus of claim 14, wherein the regulating the temperature of the hydrogen peroxide precursor below a temperature of 70° C. comprises regulating the temperature of the hydrogen peroxide precursor below a temperature of 70° C. during flow through the gas dispenser.

16. The apparatus of claim 11, wherein the precursor delivery system comprises:
a metal precursor source in fluid communication with the reaction chamber for providing the metal vapor phase precursor;
a silicon precursor source in fluid communication with the reaction chamber for providing the silicon vapor phase precursor; and
a hydrogen peroxide precursor source in fluid communication with the reaction chamber for providing the hydrogen peroxide precursor.

17. The apparatus of claim 11, wherein in at least a portion of the at least one chamber wall comprise is temperature-controlled.

18. The apparatus of claim 17, wherein the regulating the temperature of the hydrogen peroxide precursor below a temperature of 70° C. comprises regulating the temperature of the hydrogen peroxide precursor in the reaction chamber.

19. The apparatus of claim 11, wherein the metal silicate film comprises at least one of:
a carbon impurity level of less than 1 atomic-%; or
a halide level of less than about 0.2 atomic-%.

20. A semiconductor processing apparatus, comprising:
a reaction chamber configured to hold a substrate, the reaction chamber including at least one chamber wall;
a precursor delivery system in fluid communication with the reaction chamber;
a gas dispenser coupled to the reaction chamber in fluid communication with the precursor delivery system; and
a controller operably connected to at least one of the reaction chamber, the precursor delivery system, or the gas dispenser and comprising a storage medium having instructions stored thereon configured to perform operations including:

regulating a temperature of at least one of the precursor delivery system, at least a portion of the at least one chamber wall, or the gas dispenser below a temperature of 70° C.;

depositing the metal silicate film on the substrate by performing at least one unit deposition cycle of a cyclical deposition process, wherein a unit deposition cycle comprises:
   contacting the substrate with a metal vapor phase precursor from the precursor delivery system;
   contacting the substrate with a silicon vapor phase precursor from the precursor delivery system; and
   contacting the substrate with a hydrogen peroxide precursor from the precursor delivery system.

* * * * *